United States Patent [19]

Silva

[11] Patent Number: 5,115,356

[45] Date of Patent: May 19, 1992

[54] DECODER CIRCUIT WITH MISSING CLOCK GENERATOR

[75] Inventor: Fernando G. Silva, Rochester, N.Y.

[73] Assignee: Eastman Kodak Company, Rochester, N.Y.

[21] Appl. No.: 762,058

[22] Filed: Sep. 19, 1991

Related U.S. Application Data

[63] Continuation of Ser. No. 401,395, Aug. 31, 1989, abandoned.

[51] Int. Cl.⁵ .......................... G11B 5/09; G11B 20/14
[52] U.S. Cl. ........................................ 360/51; 360/40
[58] Field of Search ............... 360/51, 39, 40; 375/23, 375/110

[56] References Cited

U.S. PATENT DOCUMENTS

| | | | |
|---|---|---|---|
| 4,037,257 | 7/1977 | Chari | 360/51 |
| 4,040,022 | 8/1977 | Takii | 360/51 |
| 4,775,900 | 10/1988 | Blessinger | 360/40 |
| 4,816,697 | 10/1989 | Whitfield | 360/51 X |
| 4,912,467 | 3/1990 | Whitfield et al. | 360/44 X |
| 4,951,049 | 8/1990 | Whitfield | 360/44 X |
| 4,954,825 | 9/1990 | Chi | 360/44 X |
| 4,964,139 | 10/1990 | Wash et al. | 360/40 X |
| 4,996,608 | 2/1991 | Widney | 360/51 |
| 5,025,328 | 6/1991 | Silva | 360/46 |

Primary Examiner—David J. Severin
Attorney, Agent, or Firm—Francis H. Boos, Jr.

[57] ABSTRACT

An improved decoder circuit suitable for decoding an encoded binary data stream. The encoding is expected to generate a three-part code format, the format, in turn, comprising a pair of clock transitions that set-off a data transition. The improved decoder circuit establishes whether or not the expected format is in fact realized under arbitrary operating conditions, and in the event of a failure to realize the expected format, provides a suitable format for a subsequent decoding procedure.

4 Claims, 3 Drawing Sheets

5,115,356

DECODER CIRCUIT WITH MISSING CLOCK GENERATOR

CROSS-REFERENCE TO RELATED APPLICATIONS

This is a continuation of application Ser. No. 07/401,395, filed Aug. 31, 1989, now abandoned.

This application is related to Application Ser. No. 07/206,407 filed Jun. 14, 1988, by M. Wash abandoned; to Application Ser. No. 07/206,408 filed Jun. 14, 1988, by A. Whitfield et al. abandoned; to Application Ser. No. 07/206,553 filed Jun. 14, 1988, by A. Whitfield abandoned; to Application Ser. No. 07/206,646 filed Jun. 14, 1988 by M. Wash abandoned; to U.S. Pat. No. 4,954,835 issued Sept. 4, 1990, by C. Chi; to U.S. Pat. No. 4,951,049 issued Aug. 21, 1990, by A. Whitfield; U.S. Pat. No. 5,025,328 issued Jun. 18, 1991, by F. Silva; and to Application Ser. No. 07/344,773 filed Apr. 27, 1989 by M. Wash et al abandoned. Each of these applications patents is commonly assigned.

FIELD OF THE INVENTION

This invention relates to electrical circuits suitable for decoding an encoded binary data stream.

INTRODUCTION TO THE INVENTION

Novel methods for modulating binary data or information into a format suitable for encoding and decoding e.g., magnetic information or optical information, are disclosed in the above-cited Application Ser. Nos. 07/206,407 to M. Wash set forth in PCT International Publication WO 89/12894, and 07/327,073 to C. Chi. The novel methods both feature self-clocking, velocity insensitive encoding and decoding.

Electrical circuits that may be employed for realizing the decoding schemes set forth in the Wash method are disclosed in the above-cited Application Ser. Nos. 07/206,553 and 07/206,646 PCT International Publication No. WO 89/12891 and WO 89/12892, respectively; circuits for realizing the Chi decoding scheme are disclosed in U.S. Pat. No. 4,954,825 issued Sept. 4, 1990.

The electrical circuits of the present invention are preferably employed for realizing and improving the decoding schemes set forth in the Wash method, and are therefore complementary to the decoding circuits disclosed in aforementioned Application Ser. Nos. 07/206,553; 07/206,646 and 07/344,773. The electrical circuits of the present invention, as well, provide important instruction to the end of improving the decoding circuits dedicated to the Chi method.

SUMMARY OF THE INVENTION

The novel method of Wash is first set forth, with examples, in order to provide a perspective for the present invention.

Accordingly, in one embodiment, Wash discloses a method for modulating binary data comprising first and second information, the method comprising:

(1) defining a bitcell as the time t between two adjacent clock transitions;

(2) writing a first clock transition at the beginning of the bitcell; and (3) encoding a binary data transition after the first clock transition in the ratio of $t_d/t$, where $t_d$ is the time duration between the first clock transition and the data transition, with the proviso that $t_d/t \neq 1/n$, where $1/n$ defines a line of demarcation between a data 0 bit and a data 1 bit.

An example of the Wash method is shown in FIG. 1. The FIG. 1 comprises an encoded signal comprising a succession of two bitcells, of varying duration. Each of the bitcells is demarcated by a pair of negative clock transitions. A first information, a data 0, is encoded in the first bit cell, while a second information, a data 1, is encoded in the second bitcell. Thus, by definition of the Wash method, the first bitcell encodes the data 0, since a data transition is written at a time $t_d/t < \frac{1}{2}$, i.e., at a time $t_d$ less than the half-way point of the first bitcell. Again, by definition, the second bitcell encodes the data 1, since a data transition is written at a time $t_d/t > \frac{1}{2}$, i.e., at a time $t_d$ greater than the half-way point of the second bitcell.

Note that the encoding of the data transitions, for both the first and second bitcells, leaves invariant the negative clock transitions. Note further, that the FIG. 1 example is consistent with an "expected" or ideal encoding format—that is, there are no missing clock transitions.

I have now recognized that the "expected" Wash encoding format, of the type shown in FIG. 1, may not be always obtainable or realizable. This is because the "expected" encoding format proceeds from ideal or theoretical assumptions, and in order to actually realize the Wash method, practical or conventional electronics or optical equipment may be employed. Now, in either the encoding step of the Wash method, or a downstream decoding step, the conventional electronics or optics may introduce, for example, spurious electronic noise, signal noise, or media-environmental debris.

The introduction of these debilitating factors, in turn, may then operate to generate an encoded signal of the type shown in FIG. 2A. Here, in sharp contrast to FIG. 1, a serial encoded signal is not of the "expected" format, since there is a "missing" clock transition (the clock transitions which are present are shown as pulses). Thus, in the second of the three "frames" which make up a "field" of the FIG. 2A serial encoded signal, there is a missing clock transition, since two consecutive data transitions are shown—and the expected format, it is recalled, requires subsequent data transitions to be separated by a clock transition. (Note, moreover, that a "missing" clock transition can include the case where the cited noise or debris factor has simply lowered a requisite "threshold" clock transition level, so that it is effectively a missing clock transition.)

The consequences of the missing clock transition may be significant, and this can be understood with reference to FIG. 2B. FIG. 2B separates out the FIG. 2A clock and data transitions, so that there are two parallel pulse trains, namely, one for the clock transitions, and one for the data transitions.

Continuing, in a downstream decoding procedure, a computation means, for example, a computer, may be programmed to provide a final step in the decoding of the FIG. 2B clock and data pulse trains. The programming, in turn, may comprise blocking off frames in the field, where each frame comprises a group M of data transitions (M=5 in FIG. 2B) and N clock transitions (N=6 in FIG. 2B). It should be evident from the dotted portion of FIG. 2B, that a missing clock transition can oblige the computer to "reach" into a subsequent frame, to satisfy its nominal group frame count of N clock transitions. This reaching action, however, can "misalign" the mapping or synchronization of an instant data transition against its putative surrounding clock transitions, per bitcell. Worse, a misalignment can have a contagion like effect, thus misaligning every subsequent frame in the field. The final result of the original missing clock, therefore, is a possibility that the decoding of the serial encoded signal may be qualitatively impaired.

I have recognized this possible problem associated with the missing clock, and I now disclose an electrical circuit that addresses this problem, and substantially solves it. Accordingly, in one aspect, I disclose an electrical circuit suitable for decoding a binary data stream that has been encoded in a sequential bitcell code format, the encoding resulting in an encoded signal waveform that carries clock information and data information, which electrical circuit comprises:

a) a reading means for reading the encoded signal and producing a read signal, the read signal comprising a succession of bitcells, wherein each bitcell is expected to comprise a pair of clock transitions that set-off a data transition;
b) a detector means for inputting the read signal and separating the clock transitions from the data transitions, thereby generating
   (i) a first output signal comprising a succession of data transitions; and
   (ii) a second output signal comprising a succession of clock transitions;
c) a missing clock generator (MCG) for inputting the first and second output signals and executing logical operations comprising:
   (i) interrogating the first and second output signals for establishing whether or not each bitcell comprises the expected pair of clock transitions;
   (ii) generating, in the presence of the expected clock transitions, a simulated second output signal; and
   (iii) generating, in the absence of an otherwise expected clock transition, a substitute clock transition, for injection in a reconstituted second output signal; and
d) a computation means for
   (i) inputting the first output signal comprising the succession of data components from the detector means;
   (ii) inputting from the missing clock generator the simulated second output signal, or the reconstituted second output signal; and
   (iii) mapping the first output signal with the simulated or reconstituted second output signal, for assigning a decoded valuation to said first output signal.

The present invention, as defined, provides several important advantages. First, in the case of a missing or sub-threshold clock transition, the electrical circuit can operate to entirely prevent the contagion problem outlined above. That is, the possible misalignment of a particular data transition, mapped against the required surrounding clock transitions per bitcell, is contained or limited, by way of the missing clock generator, to that bitcell. Therefore, all subsequent frames in a serially encoded signal are isolated from the particular bitcell, and can be entirely and properly decoded by the computation means.

Second, the present electrical circuit provides an advantage of a significant improvement rate, in the proper decoding of data encoded in the particular bitcell which is missing the clock transition, as compared to not using the present invention.

Third, the teachings of the present invention may be directly applied to addressing and solving a problem similar to that of the missing clock transition, namely, the problem of a missing data transition.

BRIEF DESCRIPTION OF THE DRAWINGS

The invention is illustrated in the accompanying drawing, in which.

DETAILED DESCRIPTION OF THE INVENTION

Figure 3:
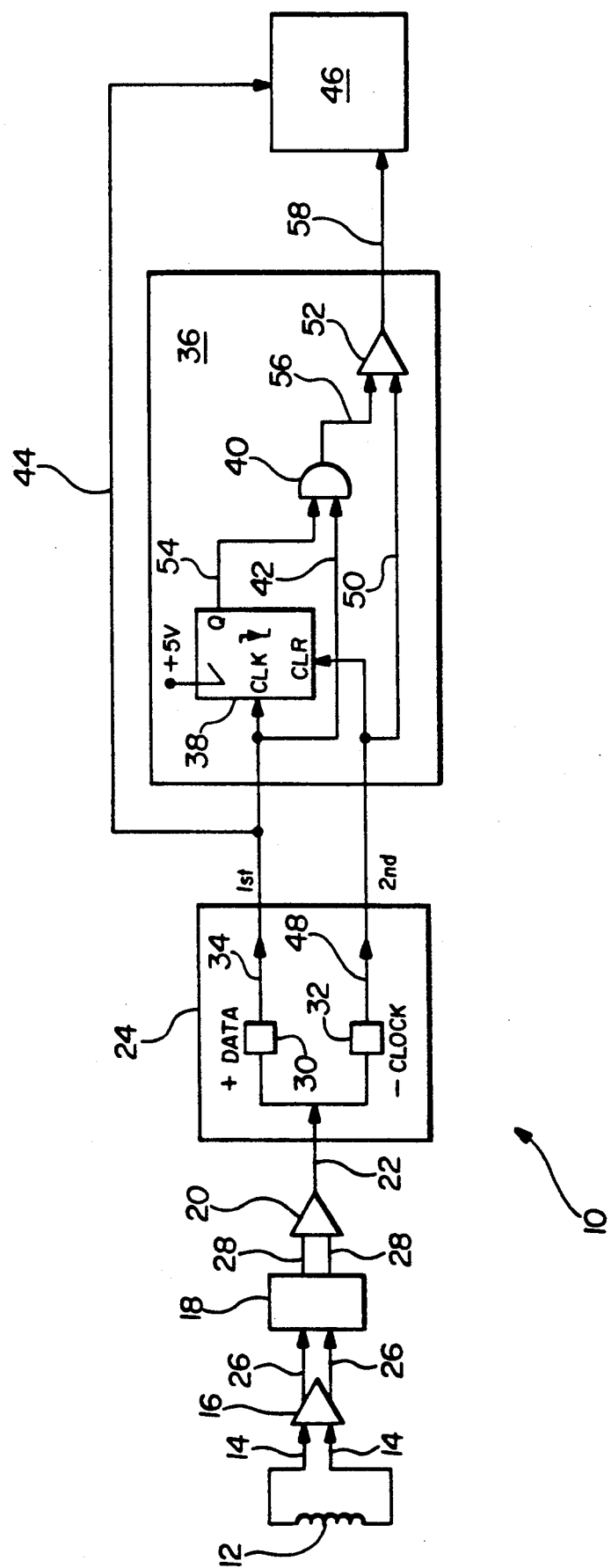
FIG. 3 shows an electrical circuit of the present invention.

Attention is now directed to FIG. 3, which shows an electrical circuit 10 of the present invention. The structure of the circuit 10 is first disclosed, followed by its operation.

Accordingly, the circuit 10 preferably comprises a magnetic read/write head 12. The head 12 can read an encoded signal, as explained more fully below (with reference to FIG. 4), and can output a read signal along a line pair 14. The read signal may be amplified by a pre-amplifier 16, filtered by a filter circuit 18, again amplified by a post-amplifier 20, and inputted along a line 22 to a detector means 24. Appropriate line pairs for processing the read signal may be provided by line pairs 26, 28.

The detector means 24, in turn, preferably comprises a positive threshold peak detector 30, and a negative threshold peak detector 32 connected in parallel to the positive threshold peak detector 30. On the one hand, the positive threshold peak detector 30 preferably first outputs a data transition or pulse train, along a line 34, for input to a missing clock generator (MCG) 36, in particular, a clock (CLK) terminal of a flip-flop 38. Second, the positive peak threshold detector 30 outputs a data transition or pulse train to an input terminal of an AND gate 40, along a line 42. Third, the positive threshold peak detector 30 outputs a data transition or pulse train, along a line 44, to a computation means 46. On the other hand, the negative threshold peak detector 32 preferably outputs a clock pulse train, along a line 48, to a clear (CLR) terminal of the flip-flop 38, and a clock transition or pulse train output, along a line 50, to an OR gate 52.

Continuing, and with further reference to FIG. 3, it may be observed that, specific to the missing clock generator 36, itself, a line 54 connects an output terminal Q of the flip-flop 38, to a second input of the AND gate 40; and that a line 56 connects an output of the AND gate 40, to a second input of the OR gate 52. Finally, a line 58 provides a connection between an output of the OR gate 52, and a second input to the computation means 46.

The operation of the FIG. 3 circuit 10 will now be disclosed, and attention is directed to the waveforms shown in FIGS. 4A–C and 5A–E.

Figure 1:
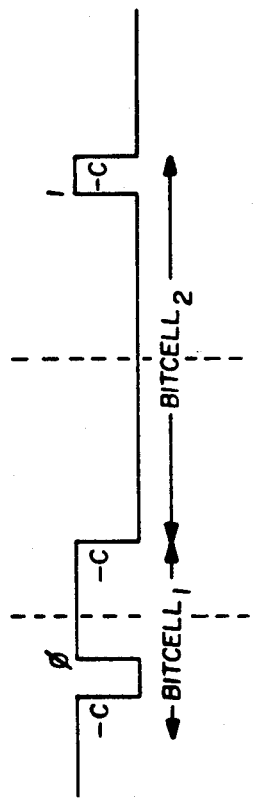
FIG. 1 shows an ideal encoding signal generated by the Wash Method.
Figure 2:
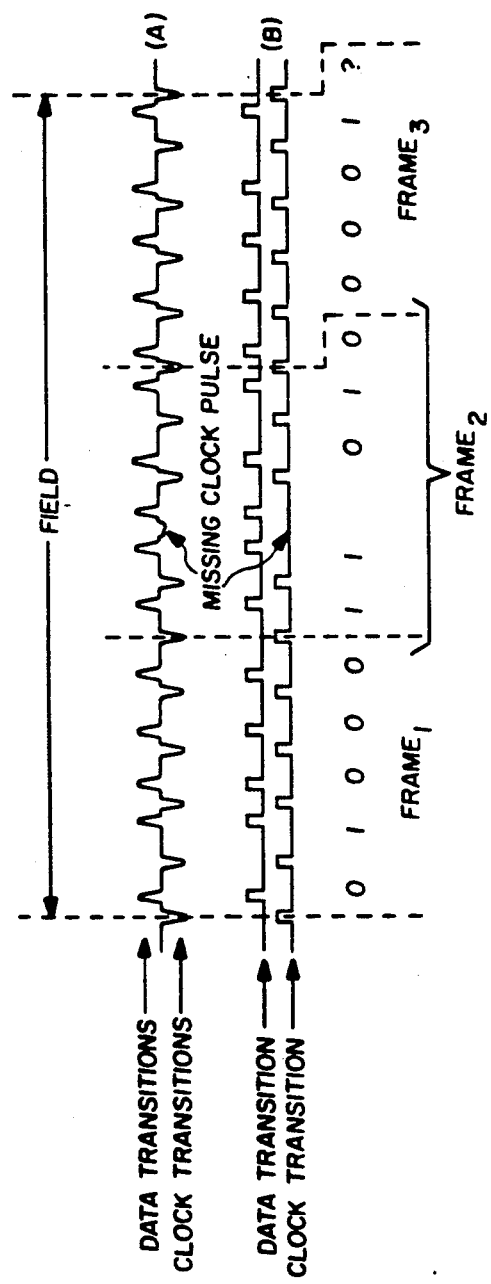
FIGS. 2A, B show an encoding signal having a missing clock transition.

An objective of the operation of the circuit 10 is to decode the FIG. 2A encoded signal, now reproduced as FIG. 4A. Recall that this encoded signal comprises a field of clock and data transitions, the field, in turn, comprising three frames. The second frame, furthermore, has a missing clock transition.

Figure 4:
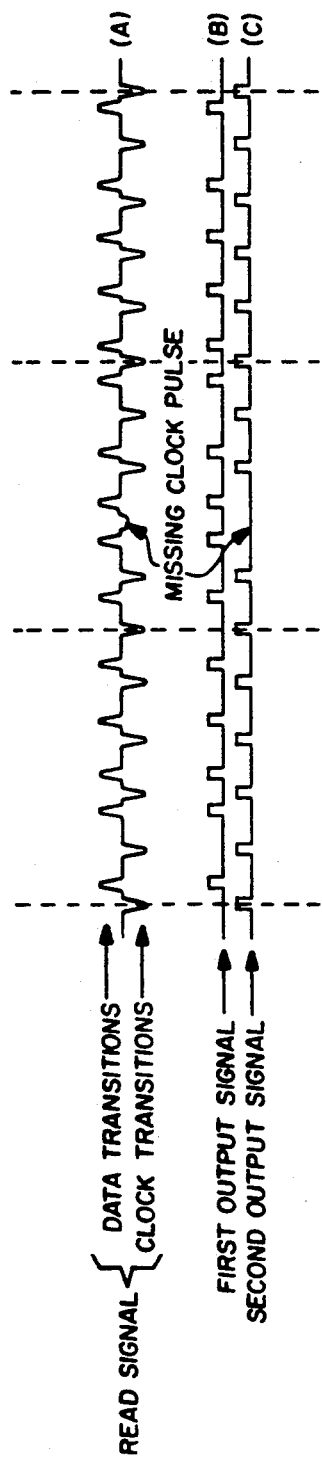
FIGS. 4A–C and FIGS. 5A–E show waveforms generated in the operation of the FIG. 3 electrical circuit.

The FIG. 4A encoded signal may be introduced to the FIG. 3 read/write head 12. The head 12 reads the FIG. 4A encoded signal, and produces a read signal for output along the line pair 14. For the purposes of the present explanation, the read signal may be thought of as having substantially the same form as that already shown in FIG. 4A. It will not, therefore, be again reproduced in FIG. 4.

Continuing, the read signal comprising clock and data transition components, is introduced into the FIG. 3 electronics: the pre-amplifier 16, the filter circuit 18, and the post-amplifier 20, for input along the line 22 to the detector means 24. Again, for pedagogical purposes, it may be assumed that the input waveform to the detector means 24, after the electronics, is substantially equivalent in form to that already shown in FIG. 4A.

The detector means 24, by way of the positive and negative threshold peak detectors 30, 32 respectively, interrogates the FIG. 4A read signal for positive and negative peaks, and generates a first output signal comprising a succession of data transitions, along the lines 34, 42, 44 and a second output signal comprising a succession of clock transitions, along the lines 48 and 50. The first and second output signals are shown in FIGS. 4B and 4C, respectively.

As indicated above, the first and second output signals input to the missing clock generator 36, which clock generator 36 preferably comprises a set of logic devices, namely, the flip-flop 38, AND gate 40, and OR gate 52. The missing clock generator 36 executes logical operations comprising:

(i) interrogating the first and second output signals for establishing whether or not each bitcell in the FIG. 4A read signal comprises the expected pair of clock transitions;

(ii) generating, in the presence of the expected clock transitions, a simulated second output signal;

(iii) generating, in the absence of an otherwise expected clock transition, a substitute clock transition, for injection in a reconstituted second output signal.

Figure 5:
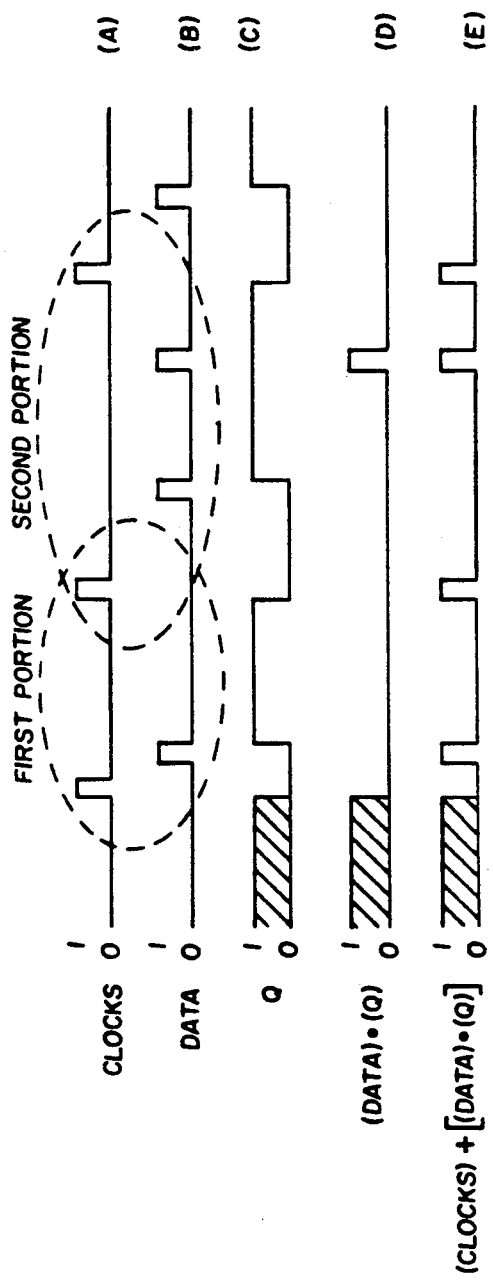

These logical operations are now explained in detail, and reference is made to FIG. 5. To facilitate the explanation, a two-fold portion of the FIG. 4 contents has been abstracted from its second frame, and reproduced in FIGS. 5A and 5B (shown in dotted outline). Accordingly, a first portion, reading from left to right, shows an expected pair of clock transitions that set-off a data transition; a subsequent second portion, in contrast, shows a clock transition followed by two consecutive data transitions, i.e., there is a missing clock transition. The logic operations are now explained by working through the first, and then the second portions.

FIG. 5C shows that the effect of the FIG. 5A first portion, first clock transition, inputted to the flip-flop 38 clear terminal along the line 48, causes the output Q of the flip-flop 38 to go to a logical low (FIG. 5C). However, at the advent of the subsequent data transition, inputted to the clock terminal of the flip-flop 38, along the line 34, the output Q goes to the logic high. Finally, the output Q again goes to a logic low (FIG. 5C), at the advent of the next clock transition.

Continuing, FIG. 5D shows the effect of this cumulative logical operation at the output 56 of the AND gate 40. In particular, FIG. 5D is the waveform of the ANDing operation of FIG. 5B (the data transitions) and FIG. 5C (the Q transitions).

FIG. 5E, on the other hand, shows the effect of this cumulative logical operation at the output 58 of the OR gate 52. In particular, FIG. 5E is the waveform of the ORing operation of FIG. 5A (the clock transitions) with FIG. 5D, itself, the result of the ANDing operation. The final FIG. 5E output 58, in turn, is inputted to the computation means 46.

We observe that FIG. 5E, in the first portion, is a simulated second output signal, i.e., it is substantially identical to FIG. 5A. This is as it should be, since the waveform in the first portion of FIG. 5A has an expected format; there are no missing clock transitions.

We now continue the reading of FIG. 5 into its second portion, where there is a missing clock transition. At the beginning of the second portion, the FIG. 5A clock transition, inputted to the flip-flop 38 along the line 48, causes the output Q to clear to a logic low (FIG. 5C). However, at the advent of the subsequent data transition, inputted to the flip-flop 38 along the line 34, the output Q goes to a logic high. Moreover, il stays at the logic high through the advent of the second, subsequent (FIG. 5B) data transition. The output Q clears to logic low (FIG. 5C), finally, at the advent of the next FIG. 5A clock transition.

FIG. 5D shows the effect of this cumulative logical operation at the output 56 of the AND gate 40. In particular, FIG. 5D again is the waveform of the ANDing operation of FIGS. 5B (the data transitions) and FIG. 5C (the Q transitions). The logical operation of the AND gate 40 is such that it goes high when both the data and Q transitions are high. This condition is now satisfied in the second portion of FIG. 5, although it had not been satisfied in the first portion of FIG. 5.

FIG. 5E, in turn, shows the waveform of the ORing operation of FIGS. 5A (the clock transitions) with FIG. 5D, the result of the ANDing operation. In particular, FIG. 5E shows a clock transition interjected in the input to the computation means 46. This interjected clock transition results in a reconstituted second output signal, the latter comprising a substitute clock transition for the otherwise missing, but expected, clock transition.

In summary, it has been demonstrated that the missing clock generator 36 performs logic operations to the end of generating, in the presence of the expected clock transition, (first portion) a simulated second output signal, for input to the computation means 46; and generating, in the absence of an otherwise expected clock transition, a substitute clock transition, for injection in a reconstituted second output signal, also for input to the computation means 46.

The computation means 46, as disclosed above, also inputs, along the line 44 from the detector means 24, the first output signal comprising the succession of data transitions. The computation means 46, preferably a computer or a microprocessor, may be programmed to map the first output signal with the simulated or reconstituted second output signal, for assigning a decoded valuation to the first output signal, in accordance with the Wash method, supra.

A computer program in accordance with the requirements of the circuit 10, for the Wash method specified above and written in BASIC, is listed below in an Appendix. Additional instruction on the operation of the circuit 10, as it relates to the Wash method, is now disclosed.

First, the clock transitions in the FIG. 4A encoding example are negative, the data transitions are positive. In other encoding signals, not shown, these transition polarities may be respectively reversed, while still uniquely distiguishing the clock from data transitions. The electrical circuit 10 may be readily adapted to decode this alternative encoding signal.

Second, as indicated in the Summary above, the data transitions and line of demarcation of an encoded signal can be located at any predetermined bitcell location, with any change being readily accommodated by the circuit 10.

Third, the circuit 10 may employ time delays, not shown, to shift the clock transition pulse train by a predetermined time. This action obviates a potential ambiguity that clock transitions or pulses could occur simultaneously, hence ambiguously, with the data transitions. Other techniques, among many, to avoid the indicated potential ambiguity, include using a leading and a trailing edge of the clock pulse to set the flip-flop 38, and input to the computation means 46.

Fourth, the flip-flop 38 logic high and low levels may be reconfigured, in accordance with conventional design techniques. For example, it is possible to use a flip-flop 38 comprising a 7474 TI D-type flip-flop, including an interfacing inverter (not shown), on the clock line 34, so that the flip-flop 38 triggers on a negative edge transition.

FIfth, the circuit 10 makes use of, e.g., a detector means, a computation means, and a logic circuit comprising AND gates and OR gates. Conventional such components can be used for this purpose.

c) a missing clock generator (MCG) for receiving the first and second output signals and executing logical operations comprising:
  (i) interrogating the first and second output signals for establishing whether or not each bitcell comprises the expected pair of clock transitions;
  (ii) generating, in the presence of the expected clock transitions, a simulated second output signal;
  (iii) generating, in the absence of an otherwise expected clock transition, a substitute clock transition, for injection in a reconstituted second output signal; and
d) a computation means for
  i) receiving the first output signal comprising the succession of data transition from the detector means;
  ii) receiving from the missing clock generator the simulated second output signal, or the reconstituted second output signal; and
  iii) mapping the first output signal with the simulated or reconstituted second output signal, for assigning a decoded valuation to said first output signal.

2. An electrical circuit according to claim 1, wherein the reading means comprises a magnetic reading head.

3. An electrical circuit according to claim 1, wherein the detector means comprises

APPENDIX A

| Line | Code | Comment |
|---|---|---|
| 10 | REM ***ROUTINE FOR DECODING THREE-PART ENCODED DATA STREAMS** | |
| 20 | A=INP (XXX) | look at input port xxx |
| 30 | If A AND CLKMASK THEN GOTO 40 | look for CLOCK to go high |
| 40 | GOTO 10 | loop if no clock |
| 50 | TOGGLE=0 | force first pass through loop |
| 60 | WHILE NOT TOGGLE | loop for counting |
| 70 | CLKCTR−CLKCTR+1 | start timing CLOCKS (bitcell length) |
| 80 | DATCTR=DATCTR+1 | start timing DATA on first CLOCK |
| 90 | B=INP (xxx) | look at input port xxx |
| 100 | IF B and DATMASK THEN DP=DATCTR | stop timing DATA (data parameter) |
| 110 | IF B and CLKMASK THEN CP=CLKCTR:TOGGLE=1 | stop timing CLOCKS (clock parameter) |
| 120 | WEND | repeat loop until second CLOCK |
| 130 | HALF=CP/2 | define ½ bit cell |
| 140 | DATAPOSITION=HALF−DP | determine data position |
| 150 | IF DATAPOSITION > 0 THEN DATABIT(I)=0 | assign digital value |
| 160 | IF DATAPOSITION < 0 THEN DATABIT(I)=1 | assign digital value |
| 170 | ELSE DATABIT(I)=9 | flag bad DATABIT |

What is claimed is:

1. An electrical circuit suitable for decoding a binary data stream that has been encoded in a sequential bitcell code format, the encoding resulting in an encoded signal waveform that carries clock information with significant timing variability between clock pulses of bitcells in the stream and data information, which electrical circuit comprises:
   a) a reading means for reading the decoded signal and producing a read signal, the read signal comprising a succession of bitcells, wherein each bitcell is expected to comprise a pair of clock transitions that set-off a data transition;
   b) a detector means for receiving the read signal and separating the clock transitions from the data transistions, thereby generating
      (i) a first output signal comprising a succession of data transitions; and
      (ii) a second output signal comprising a succession of clock transistions;
   i) a first threshold peak detector, which functions to interrogate the read signal for data transitions, and to output a first pulse train signal in correspondence to said data transitions; and
   ii) a second threshold peak detector connected in parallel to the first threshold peak detector, which functions to interrogate the read signal for clock transitions, and to output a second pulse train signal in correspondence with said clock transitions.

4. An electrical circuit according to claim 1, wherein the missing clock generator comprises a logic circuit including:
   a) a flip-flop comprising clock, clear and output terminals;
   b) an AND gate comprising first and second input terminals, and an output terminal; and
   c) an OR gate comprising first and second input terminals and an output terminal; the logic circuit further configured by i) receiving the first output signal at the flip-flop clock terminal and the AND gate first input terminal;
ii) receiving the second output signal at the flip-flop clear terminal and the OR gate first input terminal;
iii) connecting the flip-flop output terminal and the AND gate second input terminal;
iv) connecting the AND gate output terminal and the OR gate second input terminal; and
v) connecting the output of the OR gate to the computation means.

* * * * *